United States Patent
Oh et al.

(10) Patent No.: US 10,651,256 B2
(45) Date of Patent: *May 12, 2020

(54) THIN FILM TRANSISTOR SUBSTRATE FOR ORGANIC LIGHT-EMITTING DIODE DISPLAY AND MANUFACTURING METHOD THEREOF

(71) Applicant: LG Display Co., Ltd., Seoul (KR)

(72) Inventors: Kummi Oh, Seoul (KR); Hyeseon Eom, Daegu (KR); Shunyoung Yang, Geyonggi-do (KR); Jeoungin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 61 days.

This patent is subject to a terminal disclaimer.

(21) Appl. No.: 15/957,139

(22) Filed: Apr. 19, 2018

(65) Prior Publication Data

US 2018/0247991 A1    Aug. 30, 2018

Related U.S. Application Data

(63) Continuation of application No. 15/359,922, filed on Nov. 23, 2016, now Pat. No. 9,997,579.

(30) Foreign Application Priority Data

Nov. 26, 2015    (KR) .................. 10-2015-0166459

(51) Int. Cl.
*H01L 27/32*      (2006.01)
*H01L 27/12*      (2006.01)
(Continued)

(52) U.S. Cl.
CPC ...... *H01L 27/3262* (2013.01); *H01L 27/1222* (2013.01); *H01L 27/1225* (2013.01);
(Continued)

(58) Field of Classification Search
CPC ........... H01L 27/3262; H01L 21/76895; H01L 21/76897
See application file for complete search history.

(56) References Cited

U.S. PATENT DOCUMENTS 8,421,090 B2    4/2013  Choi
9,147,719 B2    9/2015  Kim et al.
(Continued)

FOREIGN PATENT DOCUMENTS

CN         104867931 A      8/2015

OTHER PUBLICATIONS

Extended European Search Report dated Apr. 10, 2017, for European Patent Application No. 16200474.1.
(Continued)

*Primary Examiner* — Jamie C Niesz
(74) *Attorney, Agent, or Firm* — Morgan, Lewis & Bockius LLP

(57) ABSTRACT

Provided are a thin film transistor (TFT) substrate and a method of manufacturing the same. A TFT substrate includes: a substrate defining a pixel area, a first TFT including: an oxide semiconductor layer, a first gate electrode on the oxide semiconductor layer, a first source electrode, and a first drain electrode, a second TFT including: a second gate electrode, a polycrystalline semiconductor layer on the second gate electrode, a second source electrode, and a second drain electrode, a first gate insulating layer under the first gate electrode and the second gate electrode, the first gate insulating layer covering the oxide semiconductor layer, a second gate insulating layer under the polycrystalline semiconductor layer, the second gate insulating layer covering the first gate electrode and the second gate electrode, and an intermediate insulating layer on the first gate electrode and the polycrystalline semiconductor layer, the intermediate insulating layer including a nitride layer.

9 Claims, 7 Drawing Sheets

(51) Int. Cl.
*H01L 51/52* (2006.01)
*H01L 51/56* (2006.01)

(52) U.S. Cl.
CPC ...... *H01L 27/1248* (2013.01); *H01L 27/1251* (2013.01); *H01L 27/3246* (2013.01); *H01L 27/3248* (2013.01); *H01L 51/5206* (2013.01); *H01L 51/5221* (2013.01); *H01L 51/56* (2013.01)

(56) References Cited

U.S. PATENT DOCUMENTS

| | | |
|---|---|---|
| 9,530,854 B2 | 12/2016 | Choi |
| 9,997,579 B2 * | 6/2018 | Oh ..................... H01L 27/3246 |
| 2010/0182223 A1 * | 7/2010 | Choi ................... G09G 3/3233 345/76 |
| 2013/0214279 A1 | 8/2013 | Nishimura et al. |
| 2015/0195941 A1 | 7/2015 | Cho et al. |
| 2015/0243688 A1 | 8/2015 | Lee et al. |
| 2015/0243723 A1 | 8/2015 | Cho et al. |
| 2017/0256569 A1 * | 9/2017 | Ohara ............... H01L 21/02164 |

OTHER PUBLICATIONS

First Notification of Office Action dated Dec. 2, 2019, issued in corresponding Chinese Patent Application No. 201611050536.X.

* cited by examiner

THIN FILM TRANSISTOR SUBSTRATE FOR ORGANIC LIGHT-EMITTING DIODE DISPLAY AND MANUFACTURING METHOD THEREOF

CROSS-REFERENCE TO RELATED APPLICATION(S)

This application claims the benefit of Korean Patent Application No. 10-2015-0166459, filed on Nov. 26, 2015, the entire disclosure of which is hereby incorporated by reference herein.

BACKGROUND

1. Technical Field

This application is a continuation of U.S. patent application Ser. No. 15/359,922, filed on Nov. 23, 2016, which claims the benefit of Korean Patent Application No. 10-2015-0166459 filed in Korea on Nov. 26, 2015, the entire disclosure of each of which is hereby incorporated by reference herein.

2. Discussion of the Related Art

Nowadays, as the information society develops, the requirements of displays for representing information are increasing. Accordingly, various flat panel displays (FPD) have been developed for overcoming many drawbacks of the cathode ray tube (CRT) display, which is heavy and bulky. The flat panel display devices include a liquid crystal display (LCD) device, a plasma display panel (PDP), an organic light-emitting diode (OLED) display device, and an electrophoresis display (ED) device.

The display panel of a flat panel display may include a thin film transistor substrate having a thin film transistor allocated in each pixel region arrayed in a matrix manner. For example, the liquid crystal display (LCD) device displays images by controlling the light transmissivity of the liquid crystal layer using the electric fields. The OLED displays images by forming an organic light-emitting diode at each pixel disposed in a matrix.

As a self-emitting display device, the organic light-emitting diode (OLED) display device has merit in very fast response speed, very high brightness, and a large viewing angle. The OLED display device using the organic light-emitting diode having the good energy efficiency can be categorized into an passive matrix type organic light-emitting diode (PMOLED) display and an active matrix type organic light-emitting diode (AMOLED) display.

FIG. 1 is a diagram illustrating a structure of a related art organic light-emitting diode. As shown in FIG. 1, the organic light-emitting diode includes an organic light-emitting material layer, and an cathode and an anode facing each other with the organic light-emitting material layer therebetween. The organic light-emitting material layer includes a hole injection layer HIL, a hole transport layer HTL, an emission layer EML, an electron transport layer ETL, and an electron injection layer EIL. The organic light-emitting diode radiates light due to energy from an exciton formed in an excitation state in which a hole (from the anode) and an electron (from the cathode) are recombined at the emission layer EML. The organic light-emitting diode display can represent video data by controlling the amount (or "brightness") of the light generated and radiated from the emission layer EML of the organic light-emitting diode, as shown in FIG. 1.

The active matrix type organic light-emitting diode (AMOLED) display shows the video data by controlling the current applied to the organic light-emitting diode using the thin film transistor (TFT). FIG. 2 is an example of a related art circuit diagram illustrating a structure of one pixel in an active matrix organic light-emitting diode (AMOLED) display. FIG. 3 is a plane view illustrating a structure of one pixel in the AMOLED according to the related art. FIG. 4 is a cross-sectional view along the line I-I' of FIG. 3 for illustrating the structure of the AMOLED according to the related art.

With reference to FIGS. 2 to 4, the active matrix organic light-emitting diode display includes a switching thin film transistor ST, a driving thin film transistor DT connected to the switching thin film transistor ST, and an organic light-emitting diode OLE connected to the driving thin film transistor DT. The switching thin film transistor ST is formed where the scan line SL and the data line DL cross. The switching thin film transistor ST selects the pixel that is connected to the switching thin film transistor ST. The switching thin film transistor ST includes a gate electrode SG branching from the gate line GL, a semiconductor channel layer SA overlapping the gate electrode SG, a source electrode SS, and a drain electrode SD.

The driving thin film transistor DT drives an anode electrode ANO of the organic light-emitting diode OLE disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light-emitting diode OLE.

With further reference to FIG. 4, the gate electrode SG of the switching thin film transistor ST and the gate electrode DG of the driving thin film transistor DT are respectively formed on the substrate SUB of the related art active matrix organic light-emitting diode display. The gate insulator GI is deposited on the gate electrodes SG and DG. The semiconductor layers SA and DA are respectively formed on the gate insulator GI overlapping with the gate electrodes SG and DG. The source electrode SS and DS and the drain electrode SD and DD are respectively formed facing and separated from each other on the semiconductor layers SA and DA. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

In particular, when the semiconductor layers SA and DA include an oxide semiconductor material, due to the characteristics of high electron mobility, there is a possibility of providing a large area thin film transistor substrate having a large charging capacitor. However, to ensure the stability of the oxide semiconductor material, it is preferable to include an etch stopper SE and DE covering the upper surface of channel area to protect them from etchants. In detail, the etch stoppers SE and DE would be formed to protect the semiconductor layers SA and DA from being back-etched by the etchant for patterning the source electrodes SS and DS and the drain electrodes SD and DD.

A color filer is formed at the area where the anode electrode ANO will be formed later. It is preferable for the color filter CF to have as large an area as possible. For example, it is preferable to overlap the color filter CF with part of the data line DL, the driving current line VDD, and/or the scan line SL. The upper surface of the substrate having these thin film transistors ST and DT and color filters CF is not even and/or smooth, but is uneven and/or rugged, e.g., having many steps. Therefore, in the related art, to make the upper surface planar and with even conditions, an overcoat layer OC is deposited on the whole surface of the substrate SUB.

Then, the anode electrode ANO of the organic light-emitting diode OLE is formed on the overcoat layer OC. Here, the anode electrode ANO is connected to the drain electrode DD of the driving thin film transistor DT through the contact hole penetrating the overcoat layer OC and the passivation layer PAS.

On the substrate SUB having the anode electrode ANO, a bank BN is formed over the area having the switching thin film transistor ST, the driving thin film transistor DT, and the various lines DL, SL, and VDD, for defining the light-emitting area. The exposed portion of the anode electrode ANO by the bank BN would be the light-emitting area.

The organic light-emitting layer OL and the cathode electrode CAT are sequentially stacked on the anode electrode ANO exposed from the bank BN. When the organic light-emitting layer OLE has a material emitting white light, each pixel can represent various colors by the color filter CF disposed under the anode electrode ANO. The organic light-emitting diode display as shown in FIG. 4 is a bottom-emission type display in which visible light is radiated to the bottom direction of the display substrate.

For the organic light-emitting diode display, the organic light-emitting diode is operated using a large current. Therefore, it is preferable that the thin film transistor for driving the organic light-emitting diode would have large current-driving characteristics. For example, the oxide semiconductor material is adaptable. Recently, as the need for a high density organic light-emitting diode display is increasing, the thin film transistor is required to have the characteristics for driving large current with less power consumption.

The oxide semiconductor material has a disadvantage in that characteristics are easily degraded by the light induced from the environment, i.e., ambient light. For the organic light-emitting diode display, the light generated at the organic light-emitting layer may be introduced into the oxide semiconductor material. In that case, it is difficult to maintain the characteristics of the thin film transistor in best condition.

For the bottom-gate structure as shown in FIG. 4, the gate metal is disposed at the bottom side of the oxide semiconductor material where the light from the outside is intruding. Therefore, the gate metal can easily block the outside light. However, in the bottom-gate structure, the source electrode and the drain electrode directly contact the semiconductor layer. When forming the source and drain electrodes, the semiconductor layer has a back channel etched (BCE) structure in which some thickness of the channel area is etched. With the BCE structure, it is very difficult to ensure the reliability and/or stability of the semiconductor's characteristics.

Currently, many products for personal and portable information devices are being rapidly developed so that displays are being developed for portable or wearable devices. For portable or wearable devices, low power consumption displays are required. With currently-used technologies, it is difficult to manufacture the display having low power consumption specialized for the portable and/or wearable devices.

SUMMARY

Accordingly, the present disclosure is directed to a thin film transistor substrate for organic light-emitting diode display and a manufacturing method thereof that substantially obviate one or more of the problems due to limitations and disadvantages of the related art.

An object of the present disclosure is to provide a thin film transistor substrate for an ultra-high density organic light-emitting diode display in which the characteristics of the channel area in the oxide semiconductor layer is maximized and optimized. Another object of the present disclosure is to provide a thin film transistor substrate having two different types of thin film transistors on the same substrate in which the number of contact holes is reduced and/or minimized for providing an organic light-emitting diode display having the ultra-high density and a high aperture ratio.

Additional features and advantages will be set forth in the description which follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided a thin film transistor substrate, including: a substrate defining a pixel area, a first thin film transistor on the substrate, the first thin film transistor including: an oxide semiconductor layer, a first gate electrode on the oxide semiconductor layer, a first source electrode, and a first drain electrode, a second thin film transistor on the substrate, the second thin film transistor including: a second gate electrode, a polycrystalline semiconductor layer on the second gate electrode, a second source electrode, and a second drain electrode, a first gate insulating layer under the first gate electrode and the second gate electrode, the first gate insulating layer covering the oxide semiconductor layer, a second gate insulating layer under the polycrystalline semiconductor layer, the second gate insulating layer covering the first gate electrode and the second gate electrode, and an intermediate insulating layer on the first gate electrode and the polycrystalline semiconductor layer, the intermediate insulating layer including a nitride layer.

In another aspect, there is provided a method of manufacturing a thin film transistor substrate, the method including: providing a substrate defining a pixel area, providing a first thin film transistor on the substrate, the providing the first thin film transistor including: providing an oxide semiconductor layer, providing a first gate electrode on the oxide semiconductor layer, providing a first source electrode, and providing a first drain electrode, providing a second thin film transistor on the substrate, the providing the second thin film transistor including: providing a second gate electrode, providing a polycrystalline semiconductor layer on the second gate electrode, providing a second source electrode, and providing a second drain electrode, providing a first gate insulating layer under the first gate electrode and the second gate electrode, the first gate insulating layer covering the oxide semiconductor layer, providing a second gate insulating layer under the polycrystalline semiconductor layer, the second gate insulating layer covering the first gate electrode and the second gate electrode, and providing an intermediate insulating layer on the first gate electrode and the polycrystalline semiconductor layer, the intermediate insulating layer including a nitride layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

Figure 1:
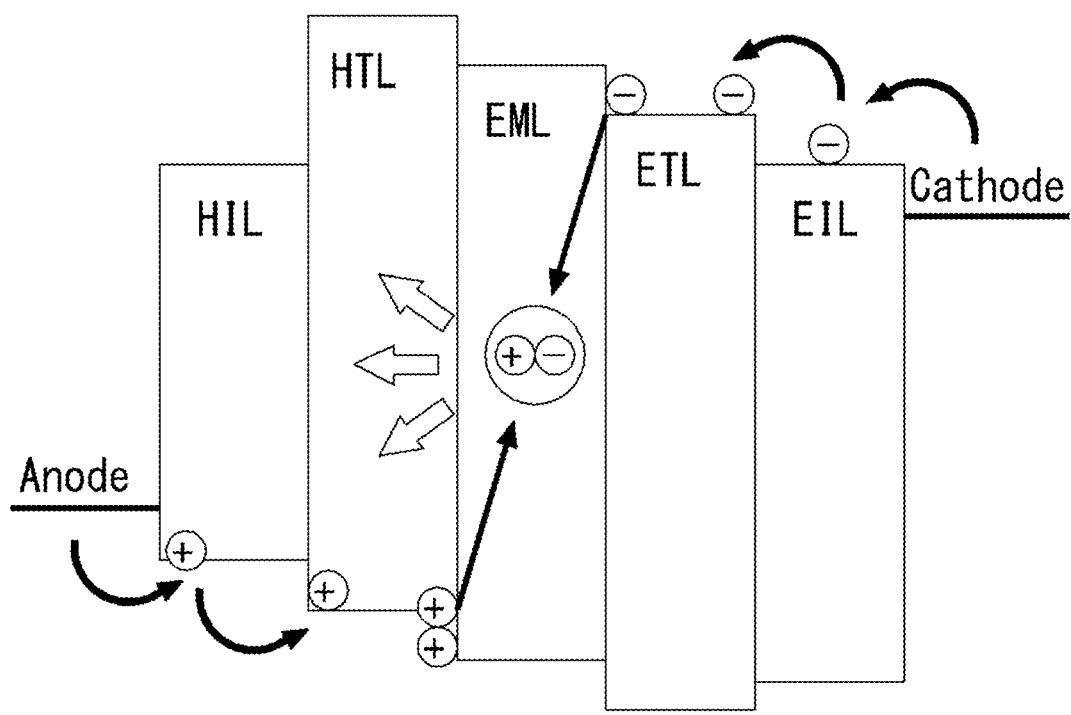
FIG. 1 is a diagram illustrating a structure of an organic light-emitting diode according to the related art.
Figure 2:
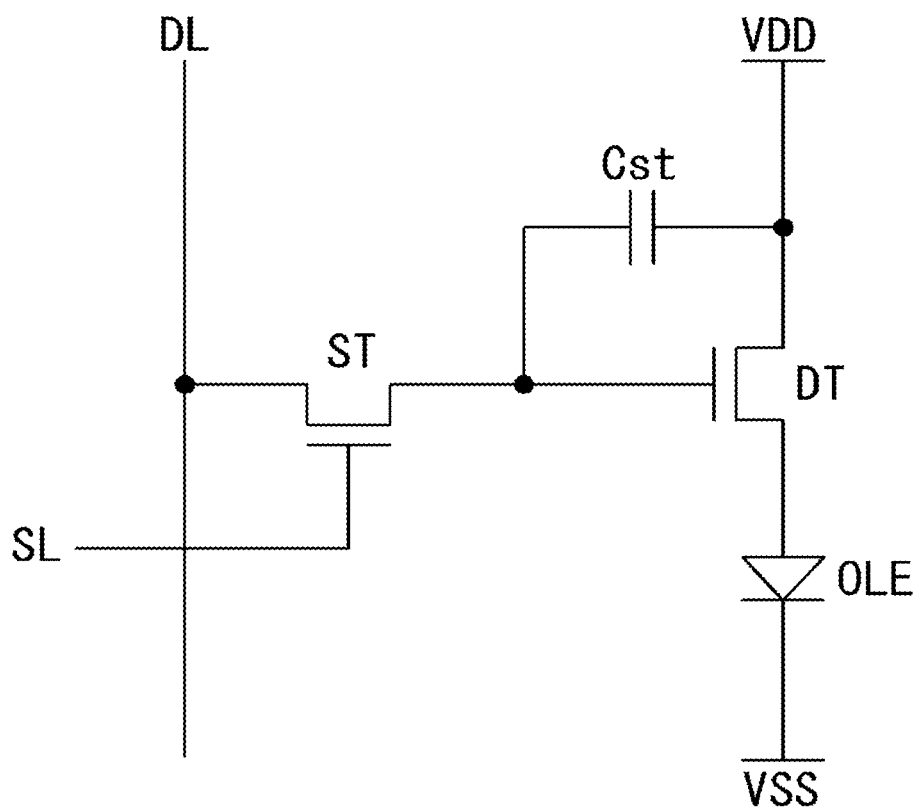
FIG. 2 is an example of a circuit diagram illustrating a structure of one pixel in an active matrix organic light-emitting diode (AMOLED) display according to the related art.
Figure 3:
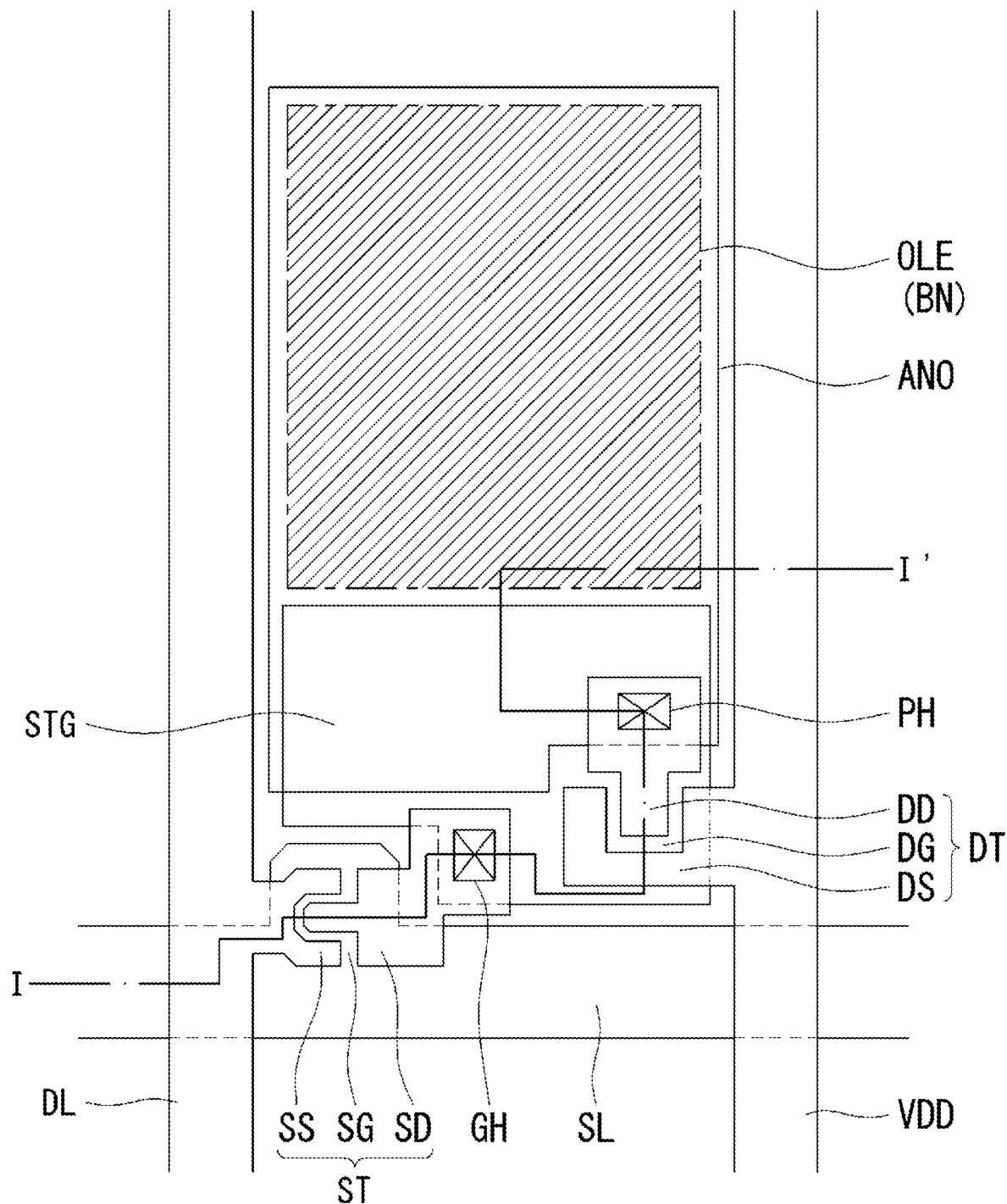
FIG. 3 is a plane view illustrating a structure of one pixel in the AMOLED according to the related art.
Figure 4:
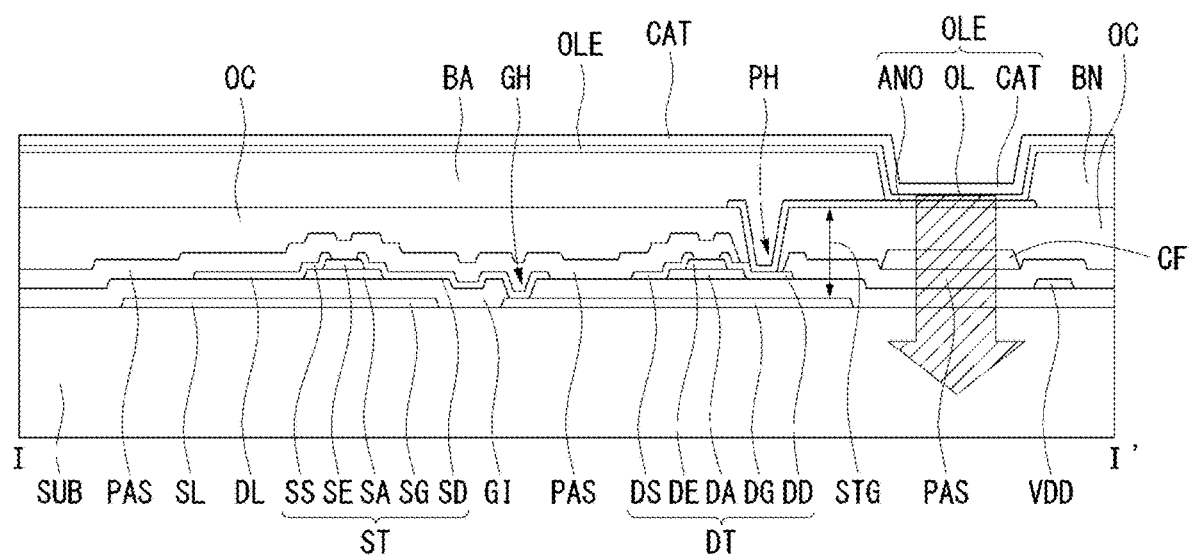
FIG. 4 is a cross-sectional view along line I-I' of FIG. 3 for illustrating the structure of the AMOLED according to the related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

The thin film transistor substrate for a flat panel display according to an embodiment may include a first thin film transistor in a first area and a second thin film transistor in a second area, on the same substrate. The substrate may include a display area and a non-display area. In the display area, a plurality of pixels may be arrayed in a matrix. The display elements may be disposed in one pixel area. The driver elements for driving the display elements in the pixel area may be in the non-display area surrounding the display area.

In one example, the first area may be the non-display area, and the second area may be part or all of the display area. For example, the first thin film transistor and the second thin film transistor may be disposed apart from each other. Otherwise, the first area and the second area may be included in the display area. In another example, if multiple thin film transistors are disposed in one pixel area, a first thin film transistor and a second thin film transistor may be close to one another.

As a polycrystalline semiconductor material has characteristics of high mobility (over 100 $cm^2/Vs$) and of low energy consumption power, and the polycrystalline semiconductor material has high reliability, it may be proper to use the polycrystalline semiconductor material in the driver IC, such as the gate driver for driving the display elements and/or the multiplexer (MUX). In addition, the polycrystalline semiconductor material can be used for the driving thin film transistor in the pixel area of the organic light-emitting diode display. As a oxide semiconductor material has a low off-current, it may be proper to use the oxide semiconductor material for the channel layer of the switching thin film transistor in the pixel area, in which the ON time period is very short but the OFF time period is long. Further, as the off-current is low, the holding time of the pixel voltage may be long, so that the oxide semiconductor material may be suitable for a display device requiring low frequency drive and/or low power consumption. By disposing these two different types of thin film transistors on the same substrate, a thin film transistor substrate representing the optimal effect may be realized.

When there are some vacancies in the polycrystalline semiconductor layer, the characteristics of the semiconductor device may be degraded. A hydrogenation process may be required for filling the vacancies with the hydrogen particles, such as hydrogen atoms or hydrogen ions. On the contrary, for a semiconductor device including the oxide semiconductor material, the semiconductor device may be degraded when a lot of hydrogen particles are diffused into the oxide semiconductor layer. Therefore, the oxide semiconductor layer may be physically separated from the polycrystalline semiconductor layer. To do so, in the structure of the thin film transistor substrate according to an embodiment, a first thin film transistor including the oxide semiconductor material may have a top-gate structure, and a second thin film transistor including the polycrystalline semiconductor material may have a bottom-gate structure.

For a hydrogenation process, a nitride layer including a lot of hydrogen particles may be deposited over the polycrystalline semiconductor layer. As the source materials used for depositing the nitride layer may have a large amount of hydrogen particles, the nitride layer may also include a large amount of the hydrogen particles. During a thermal treatment of the hydrogenation process, the hydrogen particles may be diffused into the polycrystalline semiconductor layer. As a result, the polycrystalline semiconductor layer may be stabilized. However, during this thermal treatment, a large amount of the hydrogen particles should not be diffused into the oxide semiconductor layer. To prevent there being too much of the hydrogen particles form being diffused into the oxide semiconductor layer, an oxide layer may be disposed between the nitride layer and the oxide semiconductor layer. As the oxide semiconductor layer cannot be influenced by the hydrogen particles as much in such a configuration, the oxide semiconductor layer can be maintained in stabilized condition.

Hereinafter, for convenience, a thin film transistor substrate used for an organic light-emitting diode display will be explained. In an embodiment, a first thin film transistor and a second thin film transistor may be disposed in the display area. For example, a first thin film transistor including the polycrystalline semiconductor material may be used for a driving thin film transistor, and a second thin film transistor including the oxide semiconductor material may be used for a switching thin film transistor. However, embodiments are not limited to such a configuration. For example, another thin film transistor substrate for other types of flat panel displays may have different structure, e.g., a first (polycrystalline) thin film transistor may be used for a driving thin film transistor disposed in the non-display area, and the second (oxide) thin film transistor may be used for a thin film transistor disposed in the display area.

Figure 5:
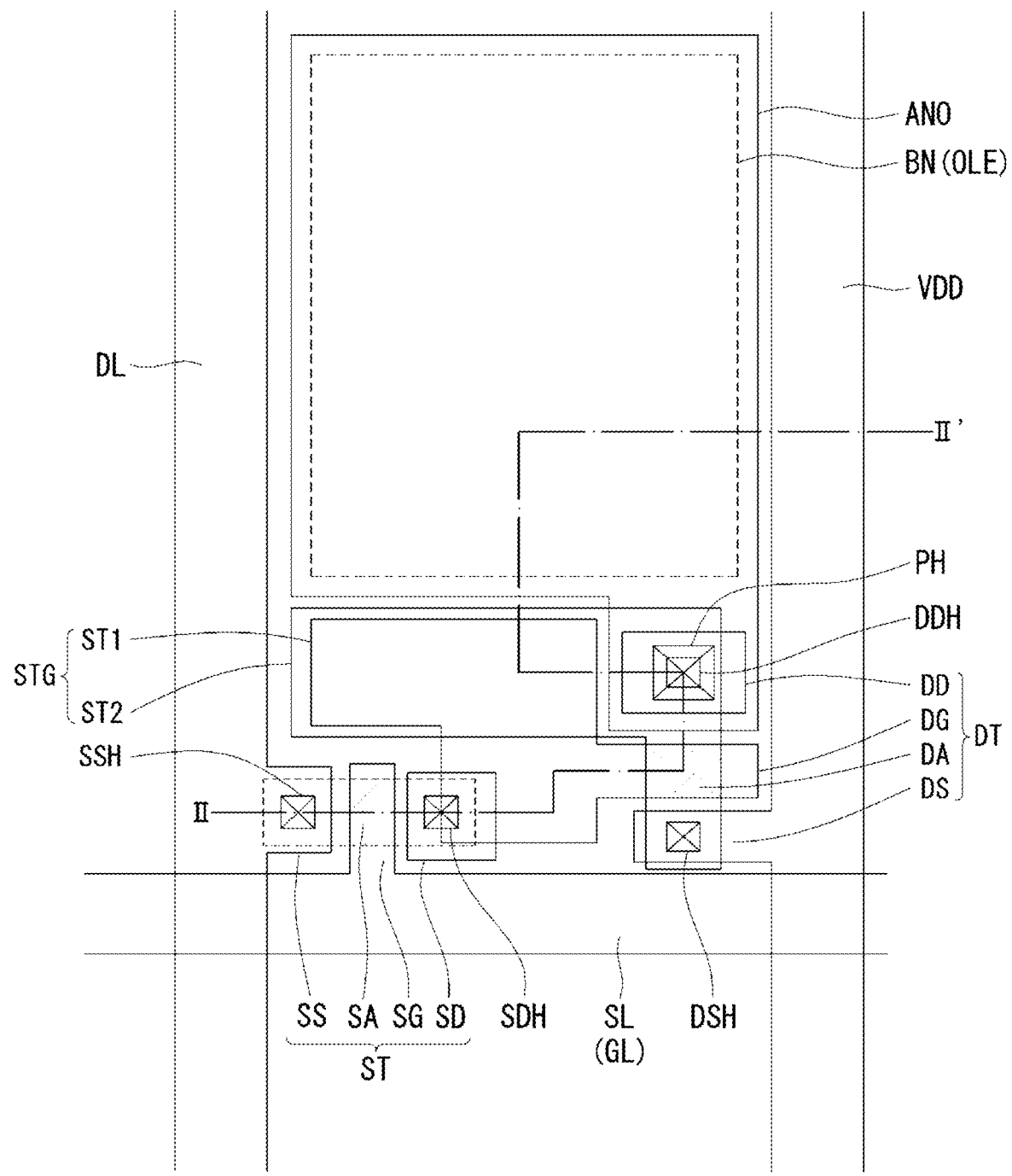
FIG. 5 is a plane view illustrating a structure of one pixel in an organic light-emitting diode (OLED) display according to an embodiment of the present disclosure.
Figure 6:
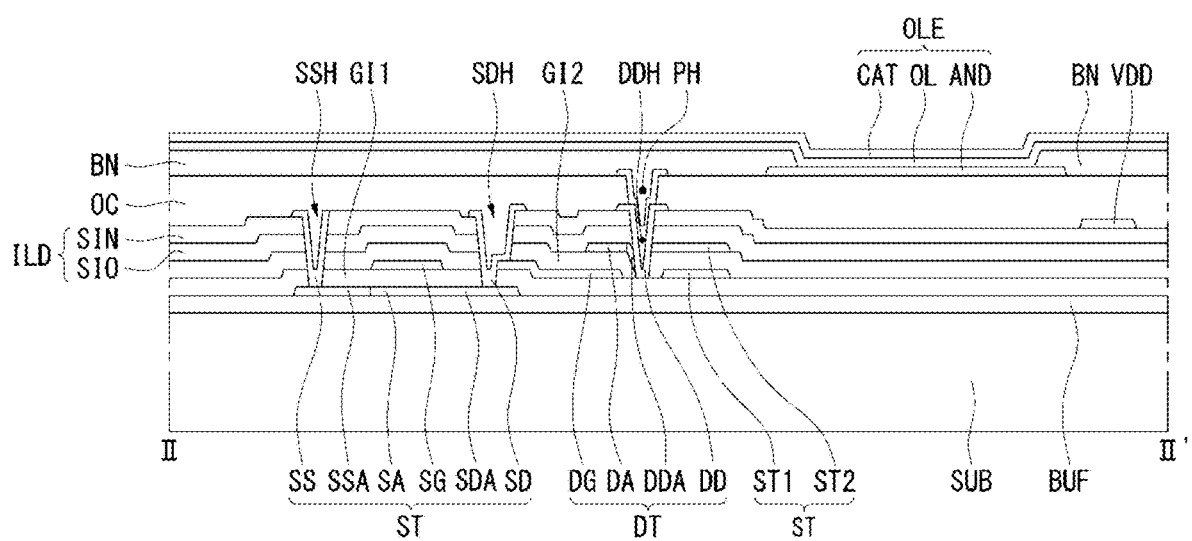
FIG. 6 is a cross-sectional view along line of II-IF of FIG. 5 for illustrating a structure of an OLED display according to an embodiment of the present disclosure.

Hereinafter, a thin film transistor substrate including two different types of thin film transistors on a same substrate, according to an embodiment of the present disclosure, with be explained with reference to FIGS. 5 and 6. FIG. 5 is a plane view illustrating a structure of one pixel in an organic light-emitting diode (OLED) display according to an embodiment of the present disclosure. FIG. 6 is a cross-sectional view along line of II-IF of FIG. 5 for illustrating a structure of an OLED display according to an embodiment of the present disclosure.

A thin film transistor substrate for an organic light-emitting diode display according to an embodiment of the present disclosure may include a switching thin film transistor ST on a substrate SUB, a driving thin film transistor DT connected to the switching thin film transistor ST, and an organic light-emitting diode OLE connected to the driving thin film transistor DT. The switching thin film transistor ST may be formed where the scan line SL and the data line DL cross. The switching thin film transistor ST may select a pixel that is connected to the switching thin film transistor ST. The switching thin film transistor ST may include a switching gate electrode SG branching from the gate line GL, a switching semiconductor layer SA overlapping the switching gate electrode SG, a switching source electrode SS, and a switching drain electrode SD.

The driving thin film transistor DT may drive an anode electrode ANO of the organic light-emitting diode OLE disposed at the pixel that is selected by the switching thin film transistor ST. The driving thin film transistor DT may include a driving gate electrode DG connected to the switching drain electrode SD of the switching thin film transistor ST, a driving semiconductor layer DA, a driving source electrode DS connected to the driving current line VDD, and a driving drain electrode DD. The driving drain electrode DD of the driving thin film transistor DT may be connected to the anode electrode ANO of the organic light-emitting diode OLE.

With reference to FIG. 6, the cross-sectional structure of the thin film transistor substrate for the organic light-emitting diode display is explained in detail according to an embodiment of the present disclosure. On a transparent substrate SUB, a buffer layer BUF may cover the whole surface of the substrate SUB. On the buffer layer BUF, a first (switching) semiconductor layer including an oxide semiconductor material may be formed. The first (switching) semiconductor layer may include a switching channel area SA at the middle portion, and may include a switching source area (SSA) and a switching drain area (SDA) at respective side portions.

On the first (switching) semiconductor layer, a first gate insulating layer GI1 may cover the whole surface of the substrate SUB. Gate elements may be formed on the first gate insulating layer GI1. The gate elements may include a switching gate electrode SG of the switching thin film transistor ST, a driving gate electrode DG of the driving thin film transistor DT, a first storage electrode ST1 extending from the driving gate electrode DG, and a scan line SL (or a gate line GL) connected to the switching gate electrode SG. The switching gate electrode SG may overlap the switching channel area SA at the middle portion of the first (switching) semiconductor layer, with the first gate insulating layer GI1 between the switching gate electrode SG and the switching channel area SA.

A second gate insulating layer GI2 may cover the whole surface of the substrate SUB on the gate elements SG, DG, and ST1. A second (driving) semiconductor layer, including a polycrystalline semiconductor material for the driving thin film transistor DT, may be formed on the second gate insulating layer GI2. The second (driving) semiconductor layer may include a driving channel area DA at the middle portion, a driving source area DSA and a driving drain area DDA at respective side portions, and a second storage electrode ST2.

The driving channel area DA of the second (driving) semiconductor layer may overlap the driving gate electrode DG, with the second gate insulating layer GI2 therebetween. One end portion of the driving drain area DDA of the second semiconductor layer may extend to and may become at least part of the second storage electrode ST2. The second storage electrode ST2 may overlap the first storage electrode ST1, with the second gate insulating layer GI2 therebetween. A storage capacitance may be formed at the overlapping portion of the second gate insulating layer GI2 between the first storage electrode ST1 and the second storage electrode ST2.

On the second (driving) semiconductor layer, an intermediate insulating layer ILD may cover the whole surface of the substrate SUB. The intermediate insulating layer ILD may include an oxide layer SIO and a nitride layer SIN on the oxide layer SIO. The nitride layer SIN may be for diffusion of the hydrogen particles into the driving channel area DA of the driving thin film transistor DT including the polycrystalline semiconductor material disposed thereunder. The oxide layer SIO may control the amount of the hydrogen particles diffused into the driving channel area DA of the driving thin film transistor DT. Therefore, the thickness of the oxide layer SIO may be varied according to the parameters or conditions of the hydrogenation process. In some embodiments, the oxide layer SIO may not be formed. In such a case, the thickness of the oxide layer SIO would be zero, and the intermediate insulating layer ILD may have only the nitride layer SIN.

The second (driving) semiconductor layer and the first (switching) semiconductor layer including the oxide semiconductor material may be under the nitride layer SIN. Therefore, the hydrogen particles diffusing out of the nitride layer SIN may also be diffused into the first semiconductor layer. However, the first gate insulating layer GI1 and the second gate insulating layer GI2 may be stacked on the first semiconductor layer. These two gate insulating layers GI1 and GI2 may be made of the oxide materials. Due to these two gate insulating layers GI1 and GI2, it may be possible to prevent too much of the hydrogen particles from diffusing into the first semiconductor layer. As mentioned above, by controlling the thickness of the intermediate insulating layer ILD, the amount of the hydrogen particle diffused into the first semiconductor layer can be precisely and/or exactly controlled.

Source elements may be formed on the intermediate insulating layer ILD. The source elements may include a switching source electrode SS and a switching drain electrode SD of the switching thin film transistor ST, a driving source electrode DS and a driving drain electrode DD of the driving thin film transistor DT, a data line DL connected to the switching source electrode SS, and a driving current line VDD connected to the driving source electrode DS. The switching source electrode SS may contact the switching source area SSA via the switching source contact hole SSH penetrating the intermediate insulating layer ILD, the second gate insulating layer GI2, and the first gate insulating layer GI1.

In addition, the switching drain electrode SD may contact the switching drain area SDA via the switching drain contact hole SDH penetrating the intermediate insulating layer ILD, the second gate insulating layer GI2, and the first gate insulating layer GI1. For example, the switching drain contact hole SDH may expose part of the driving gate electrode DG overlapping part of the switching drain area SDA. The switching drain electrode SD may contact the switching drain area SDA and the driving gate electrode DG via the switching drain contact hole SDH, such that the three electrodes may be electrically connected to each other. With only one switching drain contact hole SDH, two different elements may contact and connect to the third element at the same time. Therefore, the number of contact holes can be minimized. By reducing or minimizing the number of contact holes, the emitting area in the pixel area can be maximized.

The driving source electrode DS may contact the driving source area DSA via the driving source contact hole DSH penetrating the intermediate insulating layer ILD. The driving drain electrode DD may contact the driving drain area DDA via the driving drain contact hole DDH penetrating the intermediate insulating layer ILD. The driving source contact hole DSH and the driving drain contact hole DDH for the driving thin film transistor DT may be formed at the same time as the switching source contact hole SSH and the switching drain contact hole SDH for the switching thin film transistor ST. In forming the contact holes, the same thickness of the insulating layer may be etched. Therefore, the driving source contact hole DSH and the driving drain contact hole DDH may be formed by penetrating the intermediate insulating layer ILD, the second semiconductor layer, and the second gate insulating layer GI2. In one example, the driving source electrode DS may contact the etched side wall of the driving source area DSA, and the driving drain electrode DD may contact the etched side wall of the driving drain area DDA.

A passivation layer or a planar (overcoat) layer OC may cover the whole surface of the substrate SUB on the switching thin film transistor ST and the driving thin film transistor DT. A pixel contact hole PH exposing part of the driving drain electrode DD may be formed at the planar layer OC. In one example, the pixel contact hole PH may vertically overlap the driving drain contact hole DDH. The size of plane area for contact holes may be minimized or reduced by having two contact holes vertically overlap. The emission area in the pixel area may be maximized or enlarged by reducing or minimizing the size of the contact holes.

An anode electrode ANO may be formed on the planar layer OC. The anode electrode ANO may contact the driving drain electrode DD of the driving thin film transistor DT via the pixel contact hole PH. In one example, the anode electrode ANO may be formed as having the maximum size in the pixel area defined and surrounded by the scan line SL, the data line DL, and the driving current line VDD.

A bank BN may be formed on the substrate SUB having the anode electrode ANO. The bank BN may have an aperture defining the emission area of the anode electrode ANO. An organic light-emitting layer OL and a cathode electrode CAT may be sequentially stacked on the substrate SUB having the bank BN. An organic light-emitting diode OLE including the anode electrode ANO, the organic light-emitting layer OL, and the cathode electrode CAT may be connected to the driving thin film transistor DT.

Figure 7:
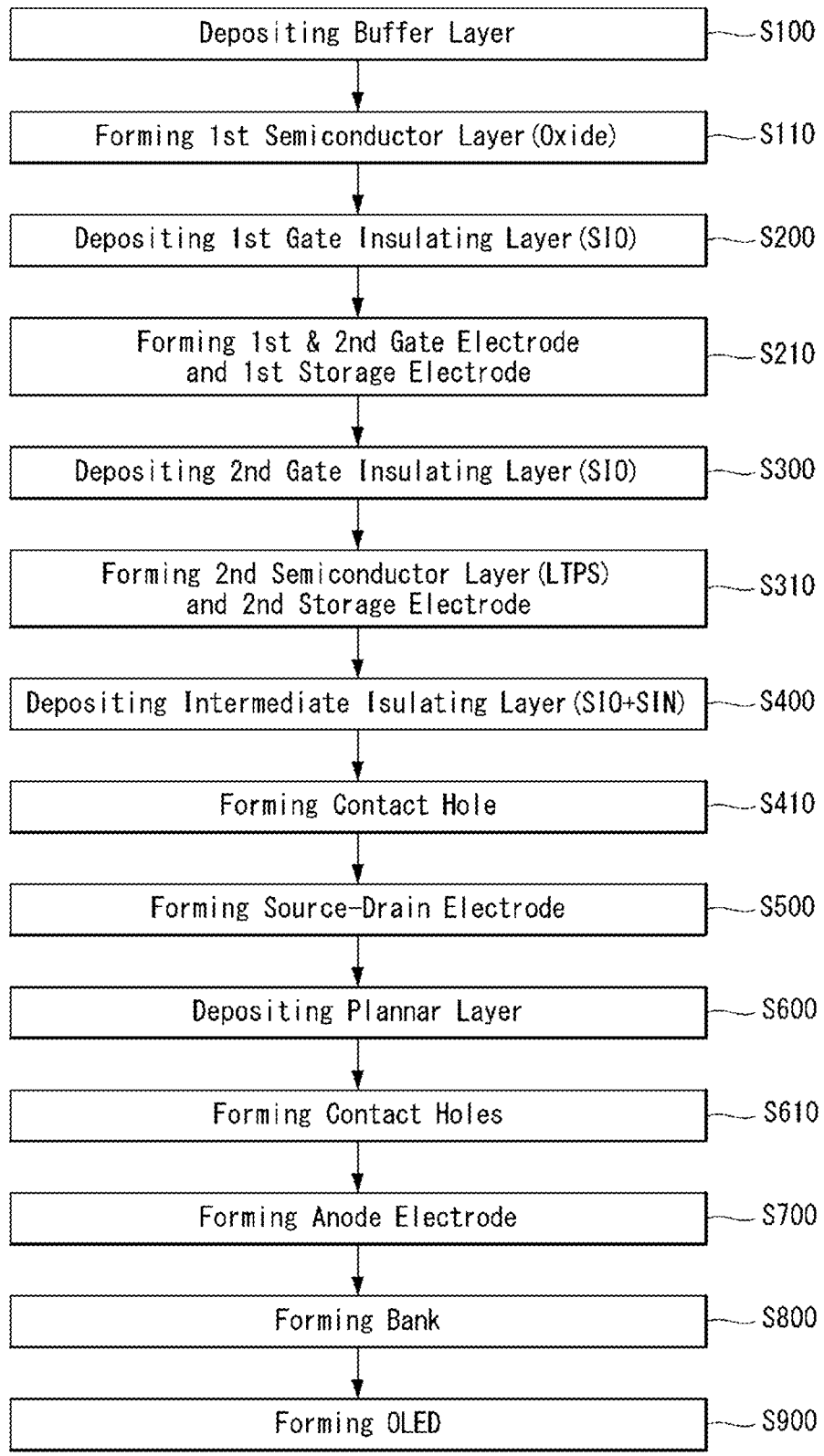
FIG. 7 is a flow chart illustrating a method for manufacturing an OLED display according to an embodiment of the present disclosure.

A method for manufacturing an organic light-emitting diode display according to an embodiment of the present disclosure with be explained with reference to FIG. 7. FIG. 7 is a flow chart illustrating a method for manufacturing an OLED display according to an embodiment of the present disclosure.

In operation S100, a buffer layer BUF may be deposited on a substrate SUB. Although not shown in figures, a light shielding layer may be formed at desired positions before depositing the buffer layer BUF.

In operation S110, an oxide semiconductor material may be deposited on the buffer layer BUF. The oxide semiconductor material may be selected from at least any one of: IGZO (Indium Gallium Zinc Oxide), IGO (Indium Gallium Oxide), and IZO (Indium Zinc Oxide), although embodiments are not limited thereto. A first semiconductor layer may be formed by patterning the oxide semiconductor layer with a first mask process. The first semiconductor layer may include a switching channel area SA, a switching source area SSA, and a switching drain area SDA of the switching thin film transistor ST.

In operation S200, a first gate insulating layer GI1 may be deposited on the substrate SUB having the first semiconductor layer. As the first gate insulating layer GI1 contacts the first semiconductor layer having the oxide semiconductor material, the first gate insulating layer GI1 may be made of an oxide insulating material, e.g., silicon oxide ($SiO_x$).

In operation S210, gate elements may be formed by depositing a gate metal on the first gate insulating layer GI and patterning the gate metal with a second mask process. The gate elements may include a switching gate electrode SG of the switching thin film transistor ST, a driving gate electrode DG of the driving thin film transistor DT, a first storage electrode ST1, and a scan line SL. The switching gate electrode SG may overlap the switching channel area SA.

In operation S300, a second gate insulating layer GI2 may be deposited on the substrate SUB having the gate elements.

As the second gate insulating layer GI2 may be close to the first semiconductor layer having the oxide semiconductor material, the second gate insulating layer GI2 may be made of an oxide insulating material, such as silicon oxide ($SiO_x$).

In operation S310, an amorphous silicon (a-Si) layer may be deposited on the second gate insulating layer GI2, and a crystallization process may be conducted to convert the amorphous silicon layer into a polycrystalline silicon layer. A second semiconductor layer may be formed by patterning the polycrystalline silicon layer with a third mask process. The second semiconductor layer may include a driving channel area DDA, a driving source area DSA, a driving drain area DDA, and a second storage electrode ST2 extending from the driving drain area DDA.

In operation S400, an intermediate insulating layer ILD may be deposited on the whole surface of the substrate SUB having the second semiconductor layer. The intermediate insulating layer ILD may be formed by sequentially depositing or stacking an oxide layer SIO and a nitride layer SIN.

In operation S410, contact holes may be formed by patterning the intermediate insulating layer ILD, the second gate insulating layer GI2, and the first gate insulating layer GI1 with a fourth mask process. The contact holes may include a switching source contact hole SSH and a switching drain contact hole SDH respectively exposing the switching source area SSA and the switching drain area SDA, and a driving source contact hole DSH and a driving drain contact hole DDH respectively exposing the driving source area DSA and the driving drain area DDA. In one example, the switching drain contact hole SDH exposing the switching drain area SDA may expose part of the driving gate electrode DG.

In operation S500, source elements may be formed by depositing a source metal on the intermediate insulating layer ILD, and then patterning the source metal with a fifth mask process. The source elements may include a switching source electrode SS, a switching drain electrode SD, a driving source electrode DS, and a driving drain electrode DD. The switching source electrode SS may contact the switching source area SSA via the switching source contact hole SSH. The switching drain electrode SD may contact the switching drain area SDA via the switching drain contact hole SDH. The switching drain electrode SD may contact the switching drain area SDA and the driving gate electrode DG via the switching drain contact hole SDH. The driving source electrode DS may contact the driving source area DSA via the driving source contact hole DSH. The driving drain electrode DD may contact the driving drain area DDA via the driving drain contact hole DDH.

In operation S600, a planar layer OC may be deposited or coated on the whole surface of the substrate SUB having the switching thin film transistor ST and the drain thin film transistor DT. In some cases, a passivation layer and the planar layer OC may be sequentially deposited.

In operation S610, a pixel contact hole PH may be formed by patterning the planar layer OC with a sixth mask process. The pixel contact hole PH may expose part of the driving drain electrode DD of the driving thin film transistor DT. The pixel contact hole PH may be formed on the driving drain contact hole DDH to vertically overlap the driving drain contact hole DDH.

In operation S700, an anode electrode ANO may be formed by depositing an electrode material on the planar layer OC and then patterning the electrode material with a seventh mask process. The anode electrode ANO may contact the driving drain electrode DD via the pixel contact hole PH.

In operation S800, a bank BN may be deposited on the substrate SUB having the anode electrode ANO. An aperture may be formed to expose most of the anode electrode ANO by patterning the bank BN with an eighth mask process.

In operation S900, an organic light-emitting layer OL and a cathode electrode CAT may be sequentially deposited on the bank BN having the aperture. Then, at the aperture of the bank BN, an organic light-emitting diode OLE may be formed by stacking the anode electrode ANO, the organic light-emitting layer OL, and the cathode electrode CAT.

In operation S410 for forming the contact holes, the switching drain contact hole SDH may be formed to expose part of the switching drain area SDA with part of the driving gate electrode DG. That is, two different elements may be formed in two different layers, which are respectively exposed through the same contact hole so that the number of the contact holes can be reduced.

Further, in operation S610 for forming the pixel contact hole PH, the pixel contact hole PH may be formed on the driving drain contact hole DDH to vertically overlap each other. That is, two different contact holes may overlap in the vertical structure. Therefore, with just one contact hole, the size for reserving the contact hole can be minimized.

The thin film transistor substrate according to an embodiment of the present disclosure may include the switching thin film transistor having the oxide semiconductor material with the top-gate structure and the driving thin film transistor having the polycrystalline semiconductor material with the bottom-gate structure. Embodiments include the thin film transistor substrate optimized for the flat display panel. In addition, by minimizing the number of the contact holes and reducing the size of the contact hole, the emission area of the organic light-emitting diode display can be enlarged and/or maximized. Consequently, embodiments may provide a high quality display having an ultra-high density resolution, a large area, and lower energy consumption.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:
1. A thin film transistor substrate, comprising:
  a substrate defining a pixel area;
  a first thin film transistor on the substrate, the first thin film transistor comprising:
    an oxide semiconductor layer;
    a first gate electrode on the oxide semiconductor layer;
    a first source electrode; and
    a first drain electrode;
  a second thin film transistor on the substrate, the second thin film transistor comprising:
    a second gate electrode;
    a polycrystalline semiconductor layer on the second gate electrode;
    a second source electrode; and
    a second drain electrode;
  a first gate insulating layer under the first gate electrode and the second gate electrode, the first gate insulating layer covering the oxide semiconductor layer;
  a second gate insulating layer under the polycrystalline semiconductor layer, the second gate insulating layer covering the first gate electrode and the second gate electrode; and an intermediate insulating layer on the first gate electrode and the polycrystalline semiconductor layer, the intermediate insulating layer comprising a nitride layer, wherein the second gate electrode overlaps part of a drain area of the oxide semiconductor layer, wherein the first gate insulating layer is between the second gate electrode and the oxide semiconductor layer, wherein the first source electrode is on the intermediate insulating layer, wherein the first source electrode contacts one side of the oxide semiconductor layer via a first source contact hole penetrating the intermediate insulating layer, the second gate insulating layer, and the first gate insulating layer, wherein the first drain electrode is on the intermediate insulating layer, and wherein the first drain electrode contacts another side of the oxide semiconductor layer and the second gate electrode, that overlaps the part of the drain area of the oxide semiconductor layer, via a first drain contact hole penetrating the intermediate insulating layer, the second gate insulating layer, and the first gate insulating layer.

2. The thin film transistor substrate of claim 1, wherein the intermediate insulating layer further comprises an oxide layer under the nitride layer.

3. The thin film transistor substrate of claim 1, wherein:
the second source electrode is on the intermediate insulating layer;
the second source electrode contacts one side of the polycrystalline semiconductor layer via a second source contact hole penetrating the intermediate insulating layer;
the second drain electrode is on the intermediate insulating layer; and
the second drain electrode contacts another side of the polycrystalline semiconductor layer via a second drain contact hole penetrating the intermediate insulating layer.

4. The thin film transistor substrate of claim 1, wherein:
the second source electrode is on the intermediate insulating layer;
the second source electrode contacts a first etched wall of one side of the polycrystalline semiconductor layer via a second source contact hole penetrating the intermediate insulating layer, the one side of the polycrystalline semiconductor layer, and the second gate insulating layer;
the second drain electrode is on the intermediate insulating layer; and
the second drain electrode contacts a second etched wall of other side of the polycrystalline semiconductor layer via a second drain contact hole penetrating the intermediate insulating layer, the another side of the polycrystalline semiconductor layer, and the second gate insulating layer.

5. The thin film transistor substrate of claim 1, wherein:
the first thin film transistor is a switching element for selecting a pixel; and
the second thin film transistor is a driving element for driving an organic light-emitting diode disposed in the pixel selected by the first thin film transistor.

6. The thin film transistor substrate of claim 1, further comprising:
a planar layer covering the first thin film transistor and the second thin film transistor;
a pixel contact hole at the planar layer, the pixel contact hole exposing the second drain electrode;
an anode electrode on the planar layer, the anode electrode being connected to the second drain electrode via the pixel contact hole;
a bank defining an aperture area exposing an emitting area of the anode electrode;
an organic light-emitting layer on the bank, the organic light-emitting layer contacting the anode electrode in the aperture area; and
a cathode electrode on the organic light-emitting layer.

7. A method for manufacturing a thin film transistor substrate for an organic light emitting diode display, the method comprising:
providing an oxide semiconductor layer on a substrate;
providing a first gate insulating layer on the oxide semiconductor layer;
providing a first gate electrode of a first thin film transistor and a second gate electrode of a second thin film transistor on the first gate insulating layer, the first gate electrode overlapping the oxide semiconductor layer;
providing a second gate insulating layer on the first gate electrode and the second gate electrode;
providing a polycrystalline semiconductor layer on the second gate insulating layer, the polycrystalline semiconductor layer overlapping the second gate electrode;
providing an intermediate insulating layer, comprising a nitride layer, on the polycrystalline semiconductor layer and on the second gate insulating layer;
providing a first drain contact hole, penetrating the intermediate insulating layer, the second gate insulating layer, and the first gate insulating layer so that the first drain electrode is connected to a drain area of the oxide semiconductor layer and the second gate electrode through the first drain contact hole;
providing first and second source electrodes and first and second drain electrodes on the intermediate insulating layer,
wherein the first thin film transistor comprises the oxide semiconductor layer, the first gate electrode on the oxide semiconductor layer, the first source electrode, and the first drain electrode,
wherein the second thin film transistor comprises the second gate electrode, the polycrystalline semiconductor layer on the second gate electrode, the second source electrode, and the second drain electrode; and
providing a passivation layer on the first thin film transistor and the second thin film transistor.

8. The method of claim 7, further comprising providing at least one of:
providing a first source contact hole, penetrating the intermediate insulating layer, the second gate insulating layer, and the first gate insulating layer, for connecting the first source electrode and a source area of the oxide semiconductor layer; or
providing a second source contact hole, penetrating the intermediate insulating layer, the polycrystalline semiconductor layer, and the second gate insulating layer, for connecting the second source electrode and a source area of the polycrystalline semiconductor layer.

9. The method of claim 7, further comprising:
providing a second drain contact hole, penetrating the intermediate insulating layer, the polycrystalline semiconductor layer, and the second gate insulating layer, for connecting the second drain electrode and a drain area of the polycrystalline semiconductor layer;

providing the passivation layer on the first and second source electrode and on the first and second drain electrode; and providing a pixel contact hole in the passivation layer disposed in the second drain contact hole for exposing the second drain electrode.

* * * * *